(12) United States Patent
Lee

(10) Patent No.: US 6,783,999 B1
(45) Date of Patent: Aug. 31, 2004

(54) SUBTRACTIVE STUD FORMATION FOR MRAM MANUFACTURING

(75) Inventor: Gill Yong Lee, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/600,057

(22) Filed: Jun. 20, 2003

(51) Int. Cl.[7] .............................................. H01L 21/00
(52) U.S. Cl. ........................................................ 438/3
(58) Field of Search ............................................ 438/3

(56) References Cited

U.S. PATENT DOCUMENTS

| | | | |
|---|---|---|---|
| 6,440,753 B1 * | 8/2002 | Ning et al. ..................... | 438/3 |
| 6,611,453 B2 * | 8/2003 | Ning .......................... | 365/171 |
| 6,635,546 B1 * | 10/2003 | Ning .......................... | 438/381 |
| 6,703,249 B2 * | 3/2004 | Okazawa et al. .............. | 438/4 |

OTHER PUBLICATIONS

Kovacs, Gregory T.A., "Micromachined Transducers Sourcebook," 1998, p. 79, WCB/McGraw–Hill, United States of America.

"Case Western Reserve University MEMS Resource, SiC MEMS at CWRU," www.mems.cwru.edu/SiC, May 15, 2003, pp. 1–3.

* cited by examiner

*Primary Examiner*—David Nelms
*Assistant Examiner*—Thao P. Le
(74) *Attorney, Agent, or Firm*—Slater & Matsil, L.L.P.

(57) ABSTRACT

A method of fabricating a magnetic memory cell and an MRAM structure. A thin conductive hard is used to pattern a magnetic stack material layer. Conductive studs are fully landed on the top of the thin conductive hard mask, preventing the magnetic memory cells from being exposed subsequent etchant chemistries. The conductive studs provide a large process window for the upper level wiring trench formation, and also provide etch selectivity during the patterning of the upper level wiring.

18 Claims, 6 Drawing Sheets

SUBTRACTIVE STUD FORMATION FOR MRAM MANUFACTURING

CROSS-REFERENCE TO RELATED APPLICATIONS

This application relates to the following co-pending and commonly assigned patent application: Ser. No. 10/600,661 which is a U.S. Pat. No. 6,713,802, filed concurrently herewith, entitled, "Magnetic Tunnel Junction Patterning using SiC or SiN," which application is hereby incorporated herein by reference.

TECHNICAL FIELD

The present invention relates generally to the fabrication of semiconductor devices, and more particularly to the fabrication of magnetic random access memory (MRAM) devices.

BACKGROUND

A more recent development in semiconductor memory devices involves spin electronics, which combines semiconductor technology and magnetics. The spin of an electron, rather than the charge, is used to indicate the presence of a "1" or "0". One such spin electronic device is a magnetic random access memory (MRAM), which includes conductive lines positioned in a different direction, e.g., perpendicular to one another in different metal layers, the conductive lines sandwiching a magnetic stack or magnetic tunnel junction (MJT), which functions as a magnetic memory cell. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1", is storable in the alignment of magnetic moments. The resistance of the magnetic memory cell depends on the moment's alignment. The stored state is read from the magnetic memory cell by detecting the component's resistive state.

An advantage of MRAMs compared to traditional semiconductor memory devices such as dynamic random access memory devices (DRAMs) is that MRAMs are non-volatile. For example, a personal computer (PC) utilizing MRAMs would not have a long "boot-up" time as with conventional PCs that utilize DRAMs. Also, an MRAM does not need to be powered up and has the capability of "remembering" the stored data. Therefore, MRAM devices are replacing flash memory, DRAM and static random access memory devices (SRAM) devices in electronic applications where a memory device is needed.

A magnetic stack comprises many different layers of metals and magnetic metals, and a thin layer of dielectric material having a total thickness of a few tens of nanometers. The magnetic stacks are typically built on top of copper wires embedded in an inter-level dielectric (ILD) material. The magnetic tunnel junctions (MTJ's) are positioned at intersections of underlying first conductive lines and overlying second conductive lines. MRAM devices are typically manufactured by forming a plurality of magnetic metal stacks arranged in an array, which comprise the magnetic memory cells. A memory cell array typically has conductive lines in a matrix structure having rows and columns.

One type of MRAM array uses a transistor to select each magnetic memory cell. Another type, a cross-point array, comprises an array of magnetic bits or magnetic stacks situated at the cross-points between two conductive lines. Information is stored in one of the magnetic layers of the magnetic stacks. To store the information, a magnetic field is necessary. In a cross-point array, this magnetic field is provided by a wordline and bitline current which is passed through conductive lines. Information is stored in the magnetic memory cells by aligning the magnetization of one ferromagnetic layer (the information layer or free layer) either parallel or antiparallel to a second magnetic layer (the reference layer or fixed layer). The information is detectable due to the fact that the resistance of the element in the parallel case is different from the antiparallel case. Magnetic stacks or memory cells in a cross-point array are usually selected by passing sub-threshold currents through the conductive lines, e.g., in both the x- and y-direction, and where the conductive lines cross at the cross-points, the combined magnetic field is large enough to change the magnetic orientation.

A critical challenge in MRAM technology is the patterning of the MTJ stack material. Because a MTJ stack includes a very thin junction layer, typically 10–20 Angstroms of aluminum oxide, shorting around the junction is a critical problem. In addition, interconnecting with the upper wiring level, e.g., the top magnetic layer of the magnetic stack is challenging due to the thin layers used in the MTJ stack which are easily damaged during etch processes.

SUMMARY OF THE INVENTION

Embodiments of the present invention provide a method of patterning a MTJ stack of a magnetic memory cell. A thin conductive hard mask is used to pattern the MTJ stack material, and a conductive stud is formed over the thin conductive hard mask, where the conductive stud is fully landed over the thin conductive hard mask so that the MTJ stack material is not exposed to etchant chemicals and processes in subsequent processing steps.

In accordance with a preferred embodiment of the present invention, a method of fabricating a magnetic memory device includes providing a workpiece having a plurality of first conductive lines formed thereon and a magnetic stack material disposed over the first conductive lines, depositing a thin conductive hard mask over the magnetic stack material, and patterning the thin conductive hard mask with a pattern for at least one magnetic memory cell. The magnetic stack material is patterned with the at least one magnetic memory cell pattern to form at least one magnetic memory cell, a conductive material is deposited over the thin conductive hard mask, and the conductive material is patterned to form at least one conductive stud over the thin conductive hard mask, wherein the at least one conductive stud is fully landed on the thin conductive hard mask. The method includes forming a plurality of second conductive lines over the at least one conductive stud, the second conductive lines running in a different direction than the first conductive lines.

In accordance with another preferred embodiment of the present invention, a method of fabricating a magnetic memory device includes providing a workpiece, depositing a first insulating layer over the workpiece, forming a plurality of first conductive lines in the first insulating layer, forming a magnetic tunnel junction (MTJ) stack material over the first conductive lines and first insulating layer, and depositing a thin conductive hard mask over the MJT stack material. A first photoresist is deposited over the thin conductive hard mask, the first photoresist is patterned with a pattern for a plurality of magnetic memory cells, and the first photoresist is used to pattern the thin conductive hard mask. The thin conductive hard mask is used to pattern the MTJ stack material and form a plurality of magnetic memory cells in the MTJ stack material, a conductive material is deposited over the thin conductive hard mask, and a second photoresist is deposited over the conductive material. The second photoresist is patterned, and the second photoresist is used to pattern the conductive material to form a conductive stud over each magnetic memory cell, wherein each conductive stud is fully landed on the thin conductive hard mask over each underlying magnetic memory cell. A plurality of second conductive lines are formed over the plurality of conductive studs, wherein the second conductive lines run in a different direction than the first conductive lines.

In accordance with yet another preferred embodiment of the present invention, a magnetic memory device includes a workpiece, a first insulating layer disposed over the workpiece, a plurality of first conductive lines disposed in the first insulating layer, and a plurality of magnetic memory cells disposed over the first conductive lines. A thin conductive hard mask material is disposed over and abutting each magnetic memory cell, and a conductive stud is disposed over and abutting the thin conductive hard mask over each magnetic memory cell, each conductive stud being fully landed on the thin conductive hard mask disposed over the underlying magnetic memory cell. A plurality of second conductive lines is disposed over and abutting the conductive studs, the second conductive lines running in a different direction than the first conductive lines.

An advantage of a preferred embodiment of the present invention includes providing a method of patterning a soft layer of a magnetic stack that does not require a high aspect ratio hard mask, which can result in redeposition of material on the sidewalls of the structure during the patterning of the MTJ stack layers, causing shorts. The conductive stud is fully landed on the thin conductive hard mask over the magnetic memory cell, preventing erosion of the magnetic memory cell materials in subsequent processing steps. The conductive studs formed result in no shorting path being created between the bottom of the MTJ stack layers and upper wiring levels due to over-etching of the trenches for the top conductive lines. The conductive studs provide a large process window for the trench formation for the top conductive lines, and also provide etch selectivity during the patterning of the top (proximate the top conductive lines) insulating layer.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a MRAM device. Embodiments of the present invention may also be applied, however, to other magnetic memory cell designs and magnetic semiconductor device applications. Only two magnetic memory cells are shown in each figure; however, there may be many other magnetic memory cells and other devices and elements manufactured in the material layers shown.

Figure 1:
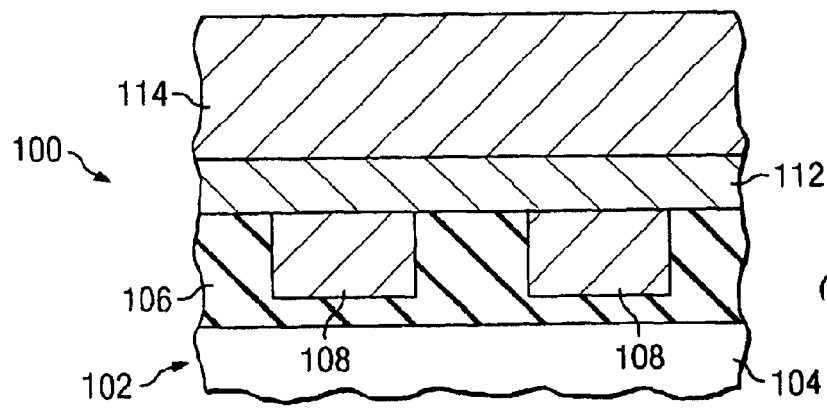
FIGS. 1 and 2 show cross-sectional views of a prior art method of patterning a bottom electrode of a magnetic memory cell at various stages of manufacturing, wherein the hard mask used to pattern the soft layer of the magnetic stack has a high aspect ratio, which can cause redeposition of material on the sidewalls of the magnetic stack, creating shorts.

FIG. 1 shows a cross-sectional view of a prior art magnetic memory device 100. The magnetic memory device 100 includes a semiconductor wafer 102 comprising a workpiece 104. The workpiece 104 has a first insulating layer 106 deposited thereon, and a plurality of first conductive lines 108 are formed within the first insulating layer 106. A magnetic stack material 112 has been deposited over the first conductive lines 108 and the first insulating layer 106. A hard mask material 114 has been deposited over the magnetic stack material layer 112, as shown in FIG. 1.

Figure 2:
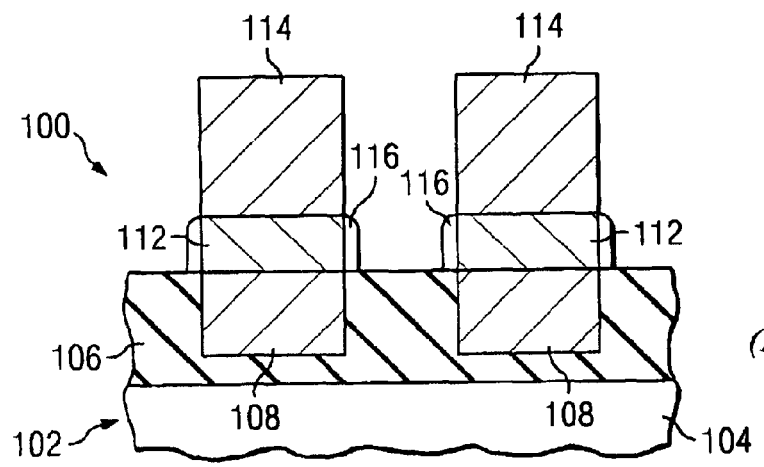

Referring now to FIG. 2, the hard mask 114 comprises a conductive material so that the underlying magnetic stack material will be electrically connected to subsequently formed second conductive lines that will reside over the hard mask 114. The hard mask 114 is patterned, for example, using a photoresist and traditional lithography, and the pattern from the hard mask 114 is transferred to the magnetic stack material 112, as shown in FIG. 2. For example, the hard mask 114 is typically used as a mask, while the magnetic stack material 112 is etched.

A problem with the process shown in FIGS. 1 and 2 is that during the patterning of the magnetic stack material 112, an etch by-product 116 or redeposition may be deposited on the sidewall of the materials 112 being patterned. For example, because the hard mask 114 has a relatively high aspect ratio, e.g., having a 2:1 to 4:1 ratio of height to width, as the magnetic stack material 112 is etched, a redeposition 116 forms on the sidewalls of the magnetic stack material 112. The redeposition 116 may comprise conductive materials and may therefore short out the magnetic memory cell 112 that is formed when the magnetic stack material is patterned.

The magnetic stack material 112 may comprise PtMn, for example. A sputter-etched PtMn layer can easily be re-deposited on the sidewall, in particular when the sidewall is high and vertical. In addition, the larger feature size of the upper wiring level that will be formed for second conductive lines (not shown) makes the local interconnect very difficult during the trench formation for the second conductive lines. It is difficult to connect the minimum feature sized magnetic memory cells 112 to upper level wiring which has a line and space feature.

Therefore, what is needed the art is a method and structure of fabricating a magnetic memory device that does not require high aspect ratio hard masks 114 in order to pattern the magnetic stack material 112.

Embodiments of the present invention provide a solution to this problem by providing a method of patterning magnetic stack material using a thin, low-aspect ratio hard mask material. A conductive stud is formed using a thin hard mask material. The conductive stud is fully landed on the thin conductive hard mask over the magnetic memory cell, such that there is no risk that the magnetic stack material will be subjected to exposure to the etchant materials used to etch the conductive stud and subsequent processing.

Figure 3:
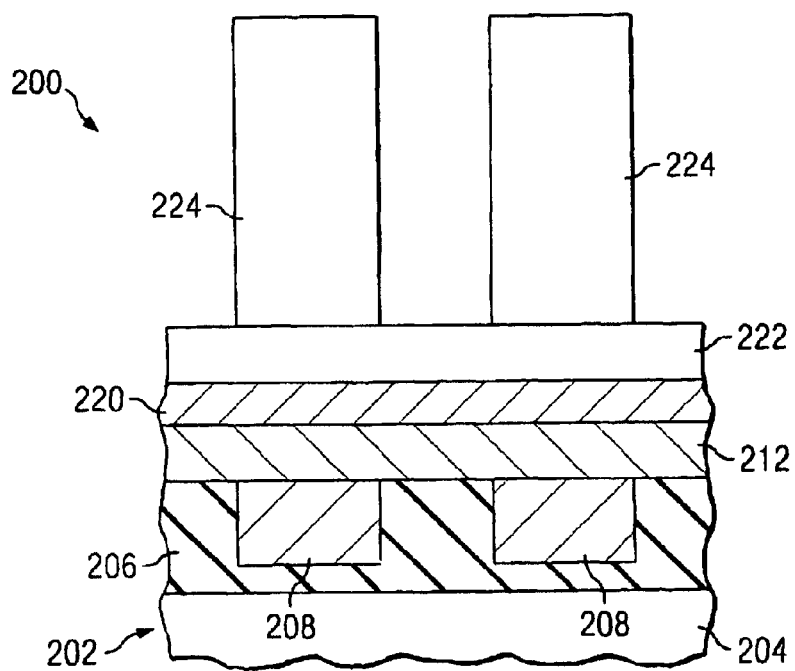
FIGS. 3 through 15 illustrate cross-sectional views of a magnetic memory device at various stages of fabrication in accordance with an embodiment of the present invention, wherein a thin conductive hard mask is used to pattern the magnetic stack material, and a conductive stud is formed over the top surface of each magnetic stack, wherein the conductive stud electrically couples the magnetic stack to a subsequently formed conductive line.

FIGS. 3 through 15 illustrate cross-sectional views of a magnetic memory cell 200 in various stages of fabrication, in accordance with an embodiment of the present invention. Referring now to FIG. 3, a semiconductor wafer 202 comprising a workpiece 204 is provided. The workpiece 204 may comprise one or more layers of a dielectric such as silicon oxide or low-k materials disposed over silicon single-crystal silicon, for example. The workpiece 204 may include other conductive layers or other semiconductor elements, such as transistors, or diodes, as examples.

A first insulating layer 206 is deposited or formed over the workpiece 204. The first insulating layer 206 may comprise an inter-level dielectric, and may comprise silicon dioxide, for example. In a damascene process, the first insulating layer 206 is patterned for first conductive lines, and a conductive material is deposited over the wafer to fill the patterned first insulating layer 206 and form first conductive lines 208. Excess conductive material is removed from the top surface of the first insulating layer 206. If the first conductive lines 208 comprise copper, the first conductive lines 208 are preferably formed in a damascene process. However, alternatively, the first conductive lines 208 may be formed by the deposition of a conductive material, a patterning and etch of the conductive material, and then the deposition of a first insulating layer 206 between the first conductive lines 208, (not shown).

The magnetic stack material 212 comprises a first conductive material deposited over the first insulating layer 208. The first conductive material may comprise tantalum, tantalum nitride, or a bi-layer of both, as examples. The first conductive material functions as a seed layer for the second conductive material deposition, which will be described further herein. The first conductive material preferably comprises a 50 Angstrom thick layer of TaN deposited over the first insulating layer 208, and a 50 Angstrom thick layer of Ta deposited over the TaN layer. The TaN layer and Ta layer preferably range between 50 to 100 Angstroms in thickness, as examples.

The magnetic stack material 212 also comprises a second conductive material deposited over the first conductive material. The second conductive material preferably comprises PtMn, and may alternatively comprise IrMn, as examples, although the second conductive material may comprise other conductive materials. The PtMn is preferably 175 Angstroms thick, and may alternatively range from 125 to 300 Angstroms thick, for examples. The second conductive material functions as the pinning layer for the free layer of the soft layer that will next be deposited.

The magnetic stack material 212 also includes a soft layer that is deposited over the second conductive material. The soft layer may comprise 1) a fixed layer comprising a layer of TaN, a layer of NiFe, and one or more optional additional magnetic layers; 2) a tunnel barrier comprising a layer of AlO; and 3) a free layer comprising a layer of CoFe, a layer of Ru, a layer of CoFe, and optional additional magnetic layers, for example. The soft layer, the second conductive material and first conductive material comprise a MTJ stack 212.

A thin conductive hard mask 220 is deposited over the MTJ stack 212. The thin conductive hard mask 220 is preferably conductive, and comprises TiN, Cu, Al, Ta, TaN or a combination thereof, although alternatively, the thin conductive hard mask 220 may comprise other conductive materials, for example. The thin conductive hard mask preferably comprises a thickness of between 50 to 500 Angstroms, as an example.

Next, an antireflective coating (ARC) 222 is deposited over the thin conductive hard mask 220, as shown in FIG. 3. A photoresist 224 is deposited over the ARC 222. The photoresist 224 is patterned, using traditional lithography, and after an ARC 222 open step, the thin conductive hard mask 220 is patterned using the photoresist 224 as a mask.

Figure 4:
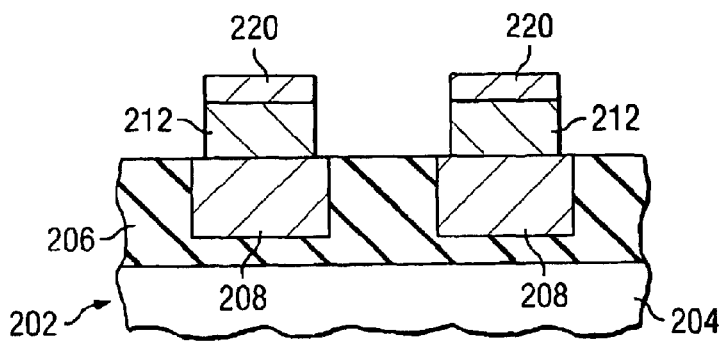

In one embodiment, the magnetic stack material 212 is patterned with the photoresist 224 remaining over the wafer 202. In another embodiment, the photoresist 224 is removed, and the magnetic stack material 212 is patterned using the thin conductive hard mask 220 as a mask. In this embodiment, a portion of the thin conductive hard mask 220 may be removed such that the thickness of the thin conductive hard mask 220 is reduced, due to consumption of the thin conductive hard mask 220 during the patterning of the magnetic stack material 212, as shown in FIG. 4. The amount of thin conductive hard mask 220 material remaining after the patterning of the magnetic stack material 212 may be 300 Angstroms or less, for example.

Figure 5:
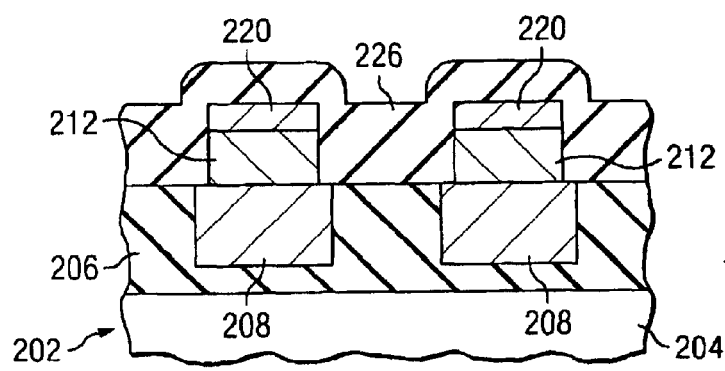

A second insulating layer 226 is deposited over the wafer 202, as shown in FIG. 5. The second insulating layer 226 comprises a dielectric fill to electrically isolate the patterned magnetic stack material 212 which form the magnetic memory cells. The second insulating layer 226 may comprise silicon dioxide, or alternatively, the second insulating layer 226 may comprise SiC, SiN, SiON, or SiCN, as described in U.S. patent application Ser. No. 10/600,661 which is a U.S. Pat. No. 6,713,802 filed concurrently herewith entitled, "Magnetic Tunnel Junction Patterning Using SiC or SiN," which is incorporated herein by reference.

Figure 6:
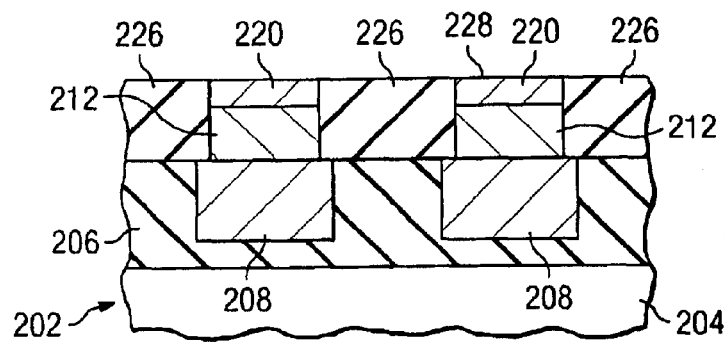
Figure 7:
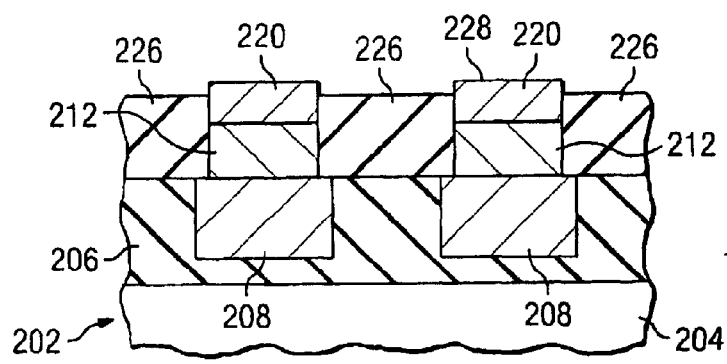

Next, the wafer 202 is exposed to a planarization process, such as a chemical mechanical polish (CMP) process step, to remove the second insulating layer 226 from the top surface of the thin conductive hard mask 220, as shown in FIG. 6 or 7. In FIG. 6, the CMP is stopped after the second insulating layer 226 is removed from the top surface of the thin conductive hard mask 220. In this embodiment, the second insulating layer 226 was deposited in an amount greater than the height of the top surface of the thin conductive hard mask 220, for example. In another embodiment, the second insulating layer 226 is deposited to a height that is lower than the top surface of the thin conductive hard mask 220, as shown in FIG. 7. In this embodiment, the CMP process is stopped when the hard mask 220 top surface is reached. Also, in this embodiment, note that the top surface of the remaining second insulating layer 226 has a lower height or thickness than the top surface of the thin conductive hard mask 220.

Figure 8:
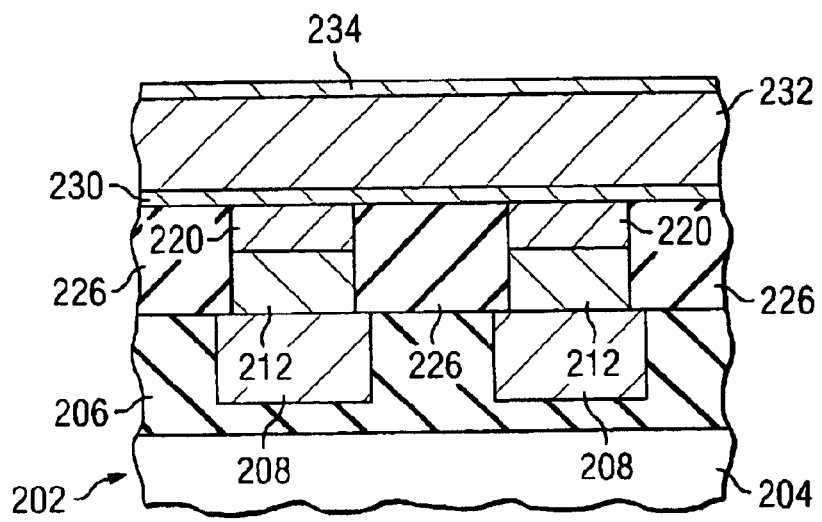

Referring next to FIG. 8, in a preferred embodiment of the present invention, a conductive material 232 is next formed using a subtractive etch process. A subtractive etch process is one wherein a layer of material is deposited, and portions of the material are etched away or removed (e.g., subtracted). A conductive material 232 is deposited over the thin conductive hard mask 220 and second insulating layer 226. An optional liner 230 may be formed over the thin conductive hard mask 220 and second insulating layer 226 prior to the deposition of the conductive material 232, as shown. The liner 230 preferably comprises a bi-layer of TiN and Ti, although alternatively, the liner may comprise TiN, Ti, TaN, or combinations thereof. The liner promotes adhesion of the conductive material 232 to the underlying second insulating layer 226 and thin conductive hard mask 220 and also protects the conductive material 232 from electromigration and stress migration.

The conductive material 232 preferably comprises 500 to 2000 Angstroms of Al, Cu or a combination thereof, as an example. For example, the conductive material 232 may comprise an aluminum-copper alloy, comprising 95 to 99 percent aluminum and 1 to 5 percent copper, as an example. Alternatively, the conductive material 232 may comprise other conductive materials.

An optional cap layer 234 may be deposited over the conductive material 232, as shown in FIG. 8. The optional cap layer 234 may comprise the same materials as the liner 230, and may comprise the thickness of 500 Angstroms or less, as an example. Note that the optional cap layer 234 is shown only in FIG. 8, although it may also be present in FIGS. 9 through 15.

Figure 9:
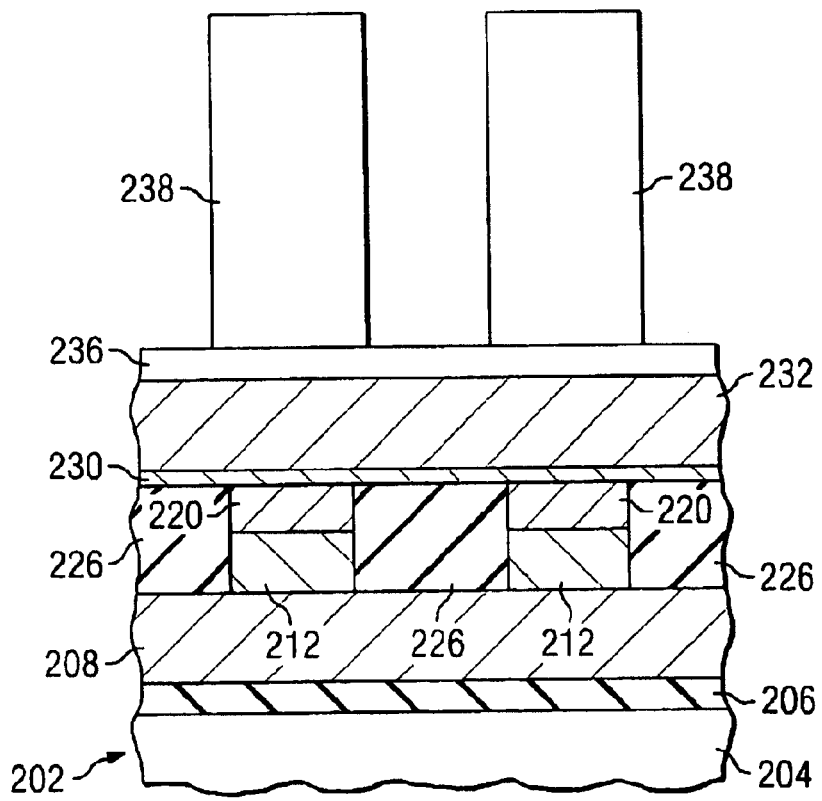

An ARC 236 is deposited over the conductive material 232, as shown in FIG. 9. Note that the cross-sectional view shown in FIG. 9 has been rotated 90 degrees from the view shown in FIG. 8, in order to show the conductive stud 230/232 and upper wiring levels. Thus, the underlying first conductive line 208 is now shown as one continuous line.

Figure 10:
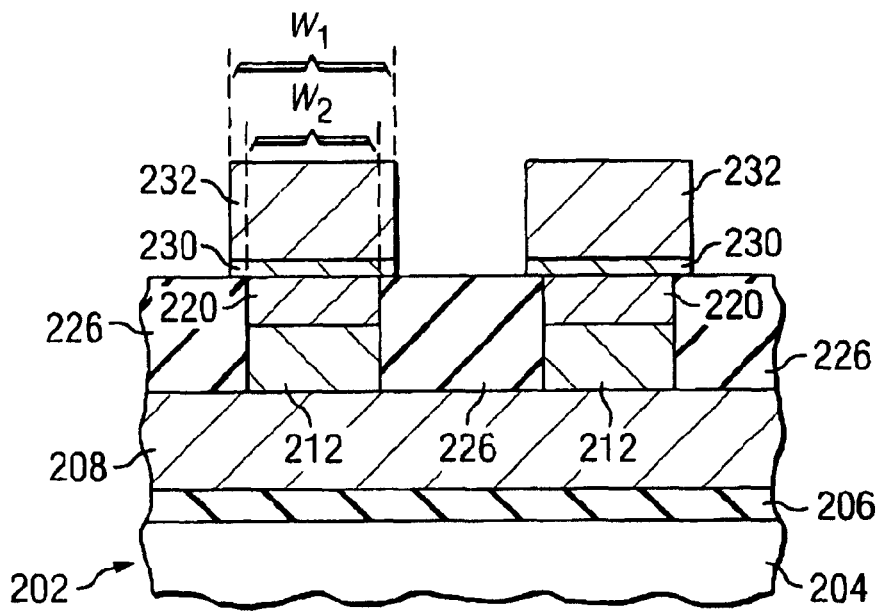

A photoresist 238 is deposited over the ARC 236. The photoresist 238 is patterned, and the ARC 236 is opened. The photoresist 238 is then used as a mask to pattern the optional cap layer 234, if present, the conductive material 232, and the liner 230. The photoresist 238 is then removed using a photoresist strip process, as shown in FIG. 10. The patterned conductive material 232, liner 230 and optional cap layer 234 (not shown in FIG. 10) comprise a conductive stud that is formed over each magnetic memory cell 212 and thin conductive hard mask 220 residing over each magnetic memory cell 212. Preferably, in accordance with embodiments of the invention, the conductive studs 232/230 are fully landed over the thin conductive hard mask 228 and over the magnetic memory cells 220. In particular, the conductive studs 232/230 preferable comprise a width $w_1$ in the lateral direction (e.g., in a horizontal direction, parallel to the surface of the wafer 202). The conductive stud 232/230 width $w_1$ is preferably greater than the width $W_2$ of the thin conductive hard mask 220 and magnetic memory cells 212, as shown in FIG. 10. Because the conductive stud 232/230 is fully landed over the thin conductive hard mask 228 and the magnetic memory cells 220, the magnetic memory cells 212 are protected from exposure to subsequent etchant materials and processes. This is advantageous in that a more reliable magnetic memory device may be manufactured.

Figure 11:
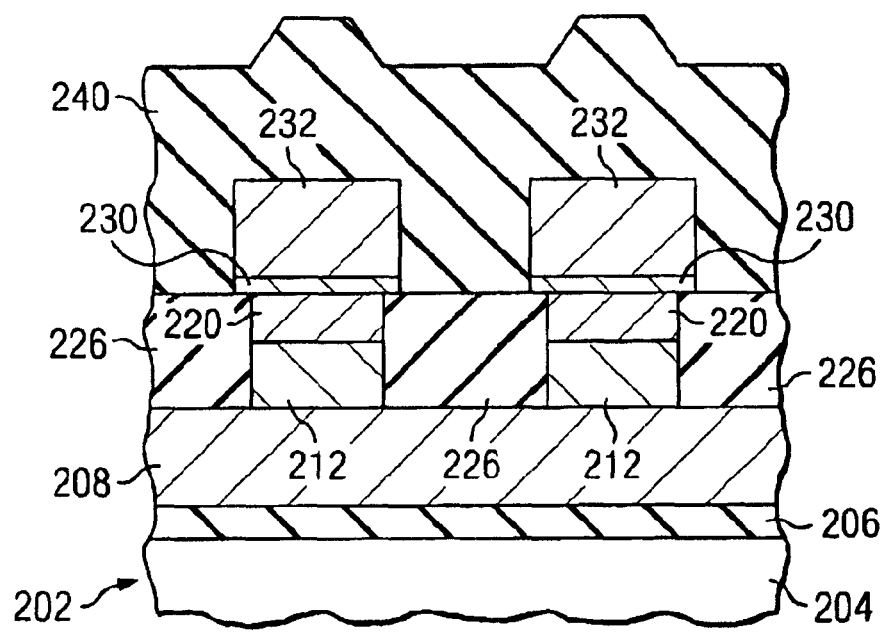

Referring next to FIG. 11, a third insulating layer 240 is then deposited over the wafer 202. The third insulating layer 240 preferably comprises silicon dioxide and is adapted to fill the gaps between the conductive studs 230/232. The third insulating layer 240 may comprise high density plasma (HDP) $SiO_2$, plasma enhanced tetraethoxysilate (PETEOS), or ozone tetraethoxysilate (TEOS). Alternatively, the third insulating layer 240 may comprise other dielectric materials deposited by a spin-on process, for example. Preferably, the third insulating layer 240 comprises a different insulating material than the second insulating material 226 in order to provide a larger process margin in subsequent processing steps. Alternatively, the third insulating layer 240 may comprise the same insulating material as the second insulating layer 226, for example.

Figure 12:
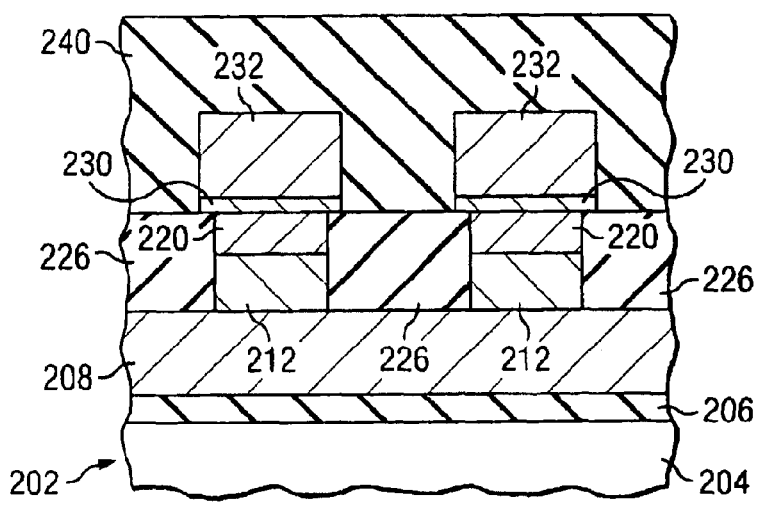

Next, in an optional step, the third insulating layer 240 is subjected to a CMP process in order to planarize the top surface of the third insulating layer, as shown in FIG. 12. This step is not required, if a spin-on dielectric is used for the third insulating layer 240, for example.

Figure 13:
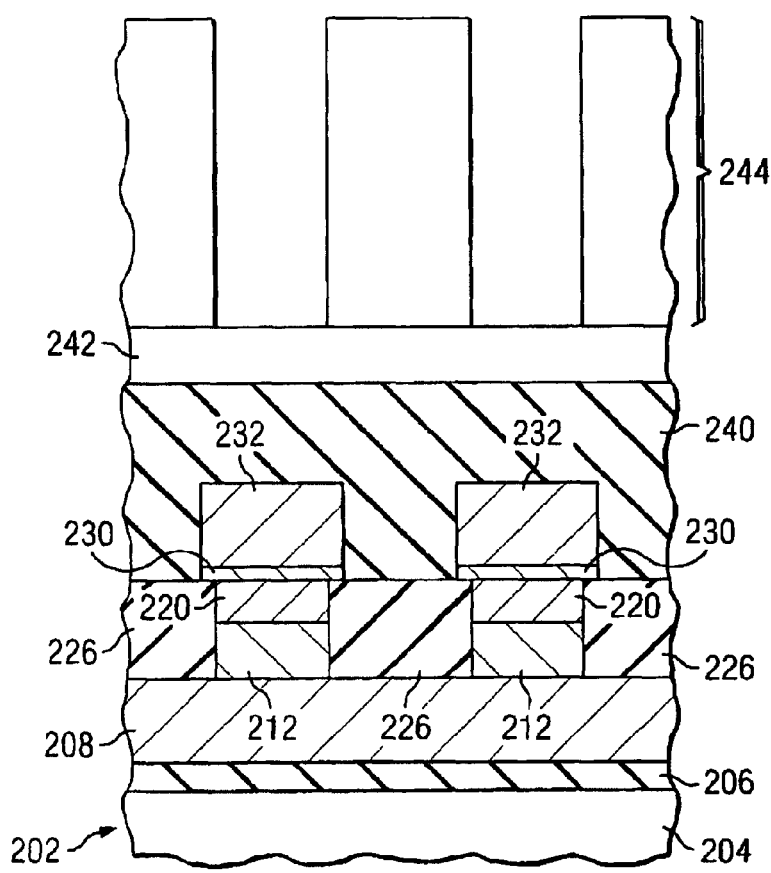

An ARC 242 is deposited over the third insulating layer 240, and a photoresist 244 is deposited over the ARC 242, as shown in FIG. 13. The photoresist 244 is patterned with the pattern for trenches that will form the second conductive lines, to be described further herein.

Figure 14:
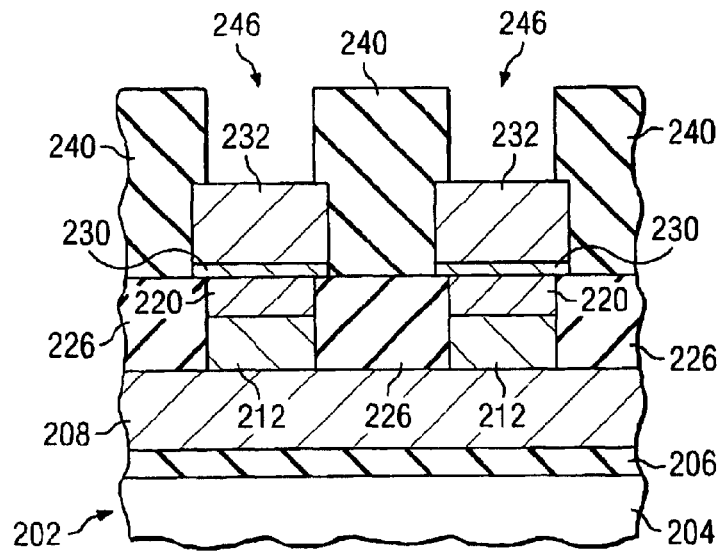

The photoresist 244 is used to pattern the third insulating layer 240 after an ARC 242 open, as shown in FIG. 14. The trenches 246 that will form second conductive lines in a damascene process have now been formed in the third insulating layer 240, as shown. Advantageously, the conductive studs 230/232 provide a large process window for the trench 246 formation. The conductive studs 230/232 also provide etch selectivity during the patterning of the third insulating layer 240.

Figure 15:
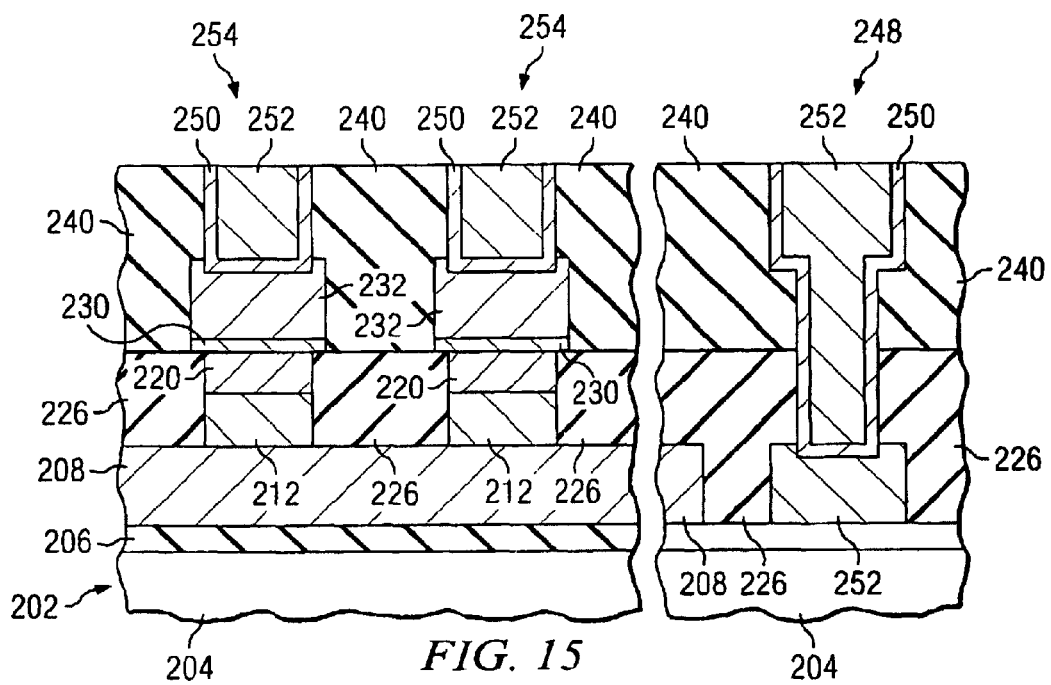

Next, if required, vias to connect to underlying first conductive lines 208 in other regions of the wafer 202 are patterned within the third insulating layer 240 and second insulating layer 226, as shown in FIG. 15. The via trenches 248 and second conductive line trenches 246 are then filled with a conductive material to form second conductive lines 254 and vias to make connections to underlying conductive lines. In this fill process, which may comprise a damascene or dual damascene process, for example, a liner 250 may first be deposited over the third insulating layer 240, and then a conductive material 252 may be deposited over the liner 250. The wafer 202 is then exposed to a CMP process to remove the excess conductive material 242 and the liner 250 from over the top surface of the third insulating layer 240, leaving the structure shown in FIG. 15. Subsequent processing is then performed on the wafer to complete the manufacturing of the magnetic memory device 200.

In one embodiment of the present invention, the thin conductive hard mask 220 comprises a cap layer of the magnetic stack material 212. This is advantageous in that an additional hard mask layer is not required. In this embodiment, the top cap layer of the magnetic stack material 212 is used as a thin conductive hard mask 220. In this embodiment, the cap layer for the magnetic stack material 212 that functions as a thin conductive hard mask 220 preferably comprises TaN in a thickness of 100 to 500 Angstroms.

Advantages of embodiments of the present invention include providing a method of manufacturing a magnetic memory device that does not require a thick high aspect ratio hard mask deposited over the magnetic stack material. Rather, a thin conductive hard mask 220 is used that does not result in redeposition of conductive material over the magnetic stack material 212 during the patterning of the magnetic stack material 212. A conductive stud 230/232 is fully landed over the top surface of the thin conductive hard mask 220, which prevents the magnetic memory cells from being subjected to or exposed to subsequent etch processes. In accordance with embodiments of the present invention, there is no shorting path between the first conductive lines 208 and second conductive lines 254 by over-etching during any trench formation. The conductive studs 230/232 provide a large process window for the trench 246 formation, and provide etch selectivity during the patterning of the third insulating layer 240.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that the materials and processes described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture compositions of matter, means, methods, or steps.

What is claimed is:

1. A method of fabricating a magnetic memory device, comprising;

providing a workpiece having a plurality of first conductive lines formed thereon and a magnetic stack material disposed over the first conductive lines;

depositing a thin conductive hard mask over the magnetic stack materials;

patterning the thin conductive hard mask with a pattern after at least one magnetic memory cell;

patterning the magnetic stack material with the at least one magnetic memory cell pattern to form at one magnetic memory cell;

depositing a conductive material over the thin conductive hard mask;

patterning the conductive material to form at least one conductive stud over the thin conductive hard mask, wherein the at least one conductive stud is fully landed on the thin conductive hard mask; and forming a plurality of second lines over the at least one conductive stud, the second conductive lines running in a different direction than the first conductive lines.

2. The method according to claim 1, wherein depositing the thin conductive hard mask comprising depositing a material layer having a thickness of 50 to 500 Angstroms.

3. The method according to claim 1, wherein depositing the thin conductive hard mask comprises depositing TiN, Cu, Al, Ta, TaN or a combination thereof.

4. The method according to claim 1, wherein depositing the thin conductive hard mask comprises depositing a cap layer over the magnetic stack material.

5. The method according to claim 1, wherein the magnetic stack material comprises a layer of TaN, Ta, PtMn or IrMn, CoFe, Ru, $Al_2O_3$, and NiFe, CoFe or NiCoFe disposed sequentially over one another.

6. The method according to claim 5, wherein the magnetic stack material further comprises a layer of TaN disposed over the top NiFe, CoFe or NiCoFe layer, wherein the top TaN layer comprises the thin conductive hard mask.

7. The method according to claim 1, wherein the at least one conductive stud has a greater lateral width than the magnetic memory cell.

8. The method according to claim 1, wherein depositing the conductive material comprises depositing 500 to 2000 Angstroms of Al, Cu or a combination thereof.

9. The method according to claim 1, wherein forming at least one magnetic memory cell comprises forming a magnetic random access memory (MRAM) cell.

10. A method of fabricating a magnetic memory device, comprising;

providing a workpiece;

depositing a first insulating layer over the workpiece;

forming a plurality of first conductive lines in the first insulating layer;

forming a magnetic tunnel junction (MTJ) stack material over the first conductive lines and first insulating layer;

depositing a thin conductive hard mask over the MJT stack material;

depositing a first photoresist over the thin conductive hard mask;

patterning the first photoresist with a pattern for a plurality of magnetic memory cells;

using the first photoresist to pattern the thin conductive hard mask;

using the thin conductive hard mask to pattern the MTJ stack material and form a plurality of magnetic memory cells in the MTJ stack material;

depositing a conductive material over the thin conductive hard mask;

depositing a second photoresist over the conductive material;

patterning the second photoresist;

using the second photoresist to pattern the conductive material to form a conductive stud over each magnetic memory cell, wherein each conductive stud is fully landed on the thin conductive hard mask over each underlying magnetic memory cell; and forming a plurality of second conductive lines over the plurality of conductive studs, the second conductive lines running in a different direction than the first conductive lines.

11. The method according to claim 10, wherein depositing the thin conductive hard mask comprises depositing a material layer having a thickness of 50 to 500 Angstroms.

12. The method according to claim 10, wherein depositing the thin conductive hard mask comprises depositing TiN, Cu, Al, Ta, TaN or a combination thereof.

13. The method according to claim 10, wherein depositing the thin conductive hard mask comprises depositing a cup layer over the magnetic stack material.

14. The method according to claim 10, wherein the magnetic stack material comprises a layer of TaN, Ta, PtMn or IrMn, CoFe, Ru, $Al_2O_3$ and NiFe, CoFe or NiCoFe disposed sequentially over one another.

15. The method according to claim 14, wherein the magnetic stack material further comprise a layer of TaN disposed over the top NiFe, CoFe or NiCoFe layer, wherein the top TaN layer comprises the thin conductive hard mask.

16. The method according to claim 10, wherein each conductive stud has a greater lateral width than the underlying magnetic memory cell.

17. The method according to claim 10, wherein depositing the conductive material comprises depositing 500 to 2000 Angstroms of Al, Cu or a combination thereof.

18. The method according to claim 10, wherein forming the plurality of magnetic memory cells comprises forming magnetic random access memory (MRAM) cells.

* * * * *

UNITED STATES PATENT AND TRADEMARK OFFICE
CERTIFICATE OF CORRECTION

PATENT NO. : 6,783,999 B1
DATED : August 31, 2004
INVENTOR(S) : Lee

It is certified that error appears in the above-identified patent and that said Letters Patent is hereby corrected as shown below:

Title page,
Item [57], ABSTRACT,
Line 2, insert -- mask -- after "hard"
Line 4, insert -- surface -- after "top"

Column 8,
Line 39, delete "$W_2$" and insert -- $w_2$ --

Column 10,
Line 17, insert a comma after the word "matter"
Line 24, insert a comma after the word "manufacture"
Line 34, delete "materials" and insert -- material --
Line 36, delete "after" and insert -- for --
Line 38, insert -- least -- after "at"
Line 46, insert -- conductive -- after "second"
Line 50, delete "comprising" and insert -- comprises --

Column 12,
Line 16, delete "cup" and insert -- cap --
Line 24, delete "comprise" and insert -- comprises --

Signed and Sealed this

Fifth Day of April, 2005

JON W. DUDAS
*Director of the United States Patent and Trademark Office*